United States Patent
Chen

(10) Patent No.: US 11,894,362 B2
(45) Date of Patent: Feb. 6, 2024

(54) PNP CONTROLLED ESD PROTECTION DEVICE WITH HIGH HOLDING VOLTAGE AND SNAPBACK

(71) Applicant: Taiwan Semiconductor Manufacturing Co., Ltd., Hsin-Chu (TW)

(72) Inventor: Jing-Ying Chen, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 125 days.

(21) Appl. No.: 17/168,295

(22) Filed: Feb. 5, 2021

(65) Prior Publication Data

US 2022/0254772 A1 Aug. 11, 2022

(51) Int. Cl.
*H01L 27/02* (2006.01)

(52) U.S. Cl.
CPC ................ *H01L 27/0262* (2013.01)

(58) Field of Classification Search
None
See application file for complete search history.

(56) References Cited

U.S. PATENT DOCUMENTS

| 9,171,833 | B2 | 10/2015 | Vinson |
| 11,302,689 | B1* | 4/2022 | Yam ................... H01L 27/0274 |
| 2019/0228984 | A1 | 7/2019 | Agam et al. |
| 2022/0190106 | A1* | 6/2022 | Nidhi ................. H01L 29/7823 |
| 2022/0223584 | A1* | 7/2022 | Appaswamy ....... H01L 21/8222 |
| 2022/0231151 | A1* | 7/2022 | Zeng ................. H01L 29/66393 |
| 2022/0336441 | A1* | 10/2022 | Chiu ..................... H01L 27/088 |

FOREIGN PATENT DOCUMENTS

TW 202036833 A 10/2020

* cited by examiner

*Primary Examiner* — Nilufa Rahim

(74) *Attorney, Agent, or Firm* — Eschweiler & Potashnik, LLC

(57) ABSTRACT

An ESD protection device protects a circuit from TLPs between a first terminal and a second terminal. The device includes an NPN discharge structure and a PNP triggering device. The first terminal is coupled to the p-doped emitter and the n-doped base of the PNP triggering device and also the n-doped emitter of the NPN discharge structure. The second terminal is coupled to the n-doped collector of the NPN discharge structure. The p-doped collector of the PNP triggering device is coupled to the p-doped base of the NPN discharge structure. A TLP causes base-collector junction breakdown in the PNP triggering device, which results in a current through the PNP triggering device. That current is injected into the base of the NPN discharge structure, which results in a larger discharge current through the NPN discharge structure. The device provides high holding voltage ESD protection device with snapback.

20 Claims, 10 Drawing Sheets

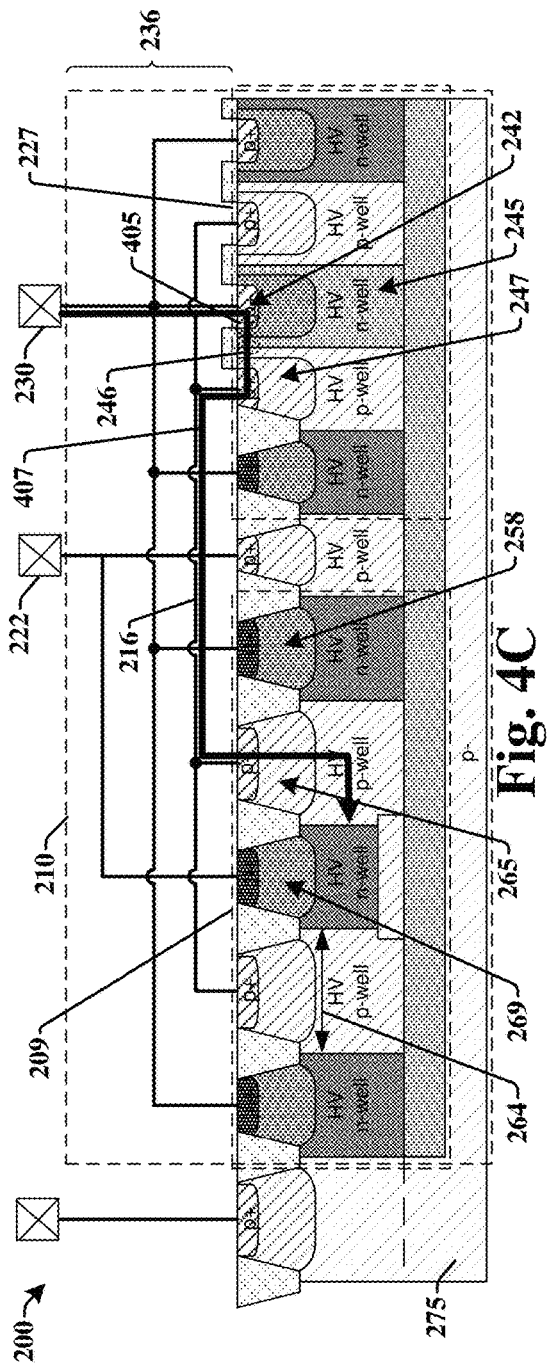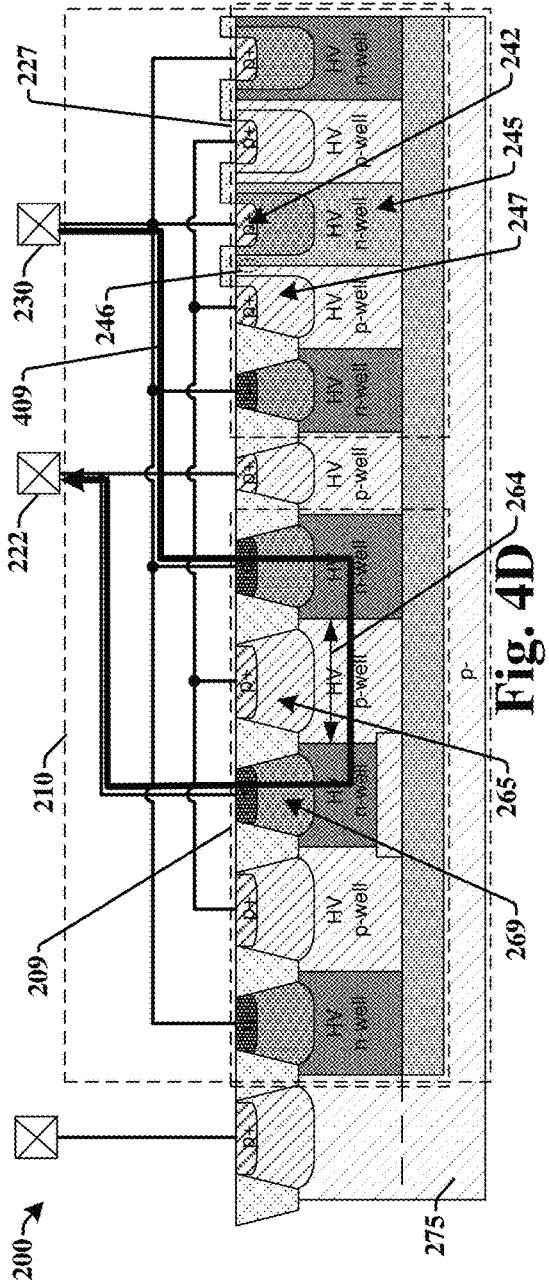

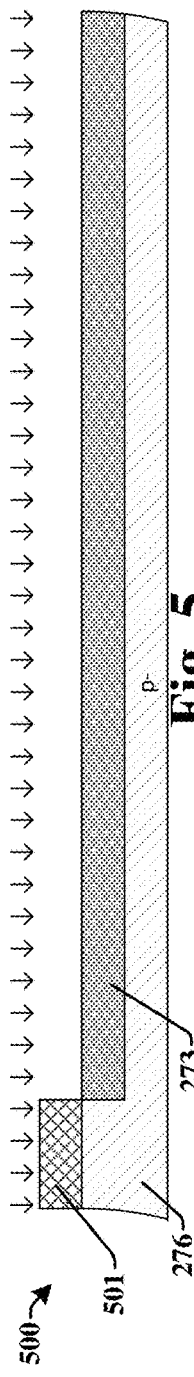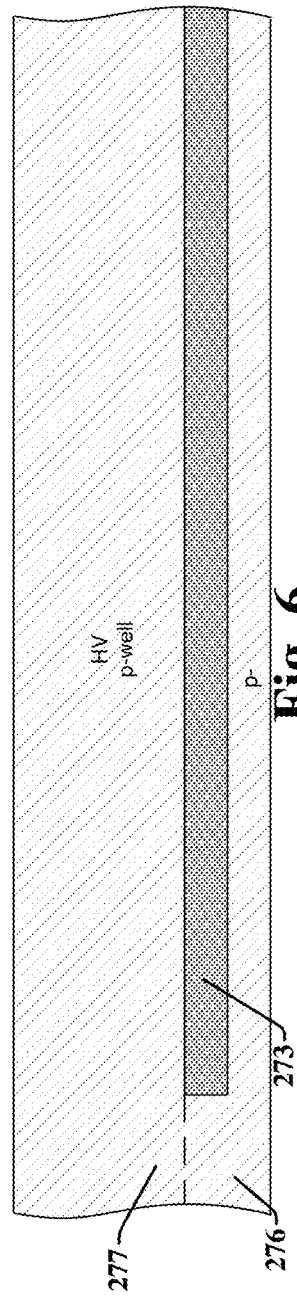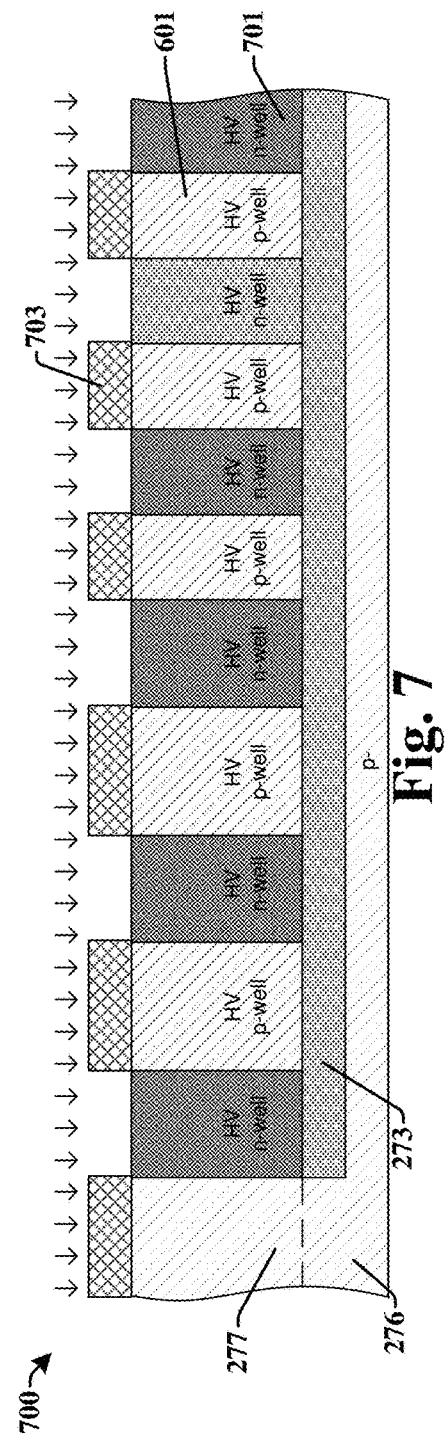

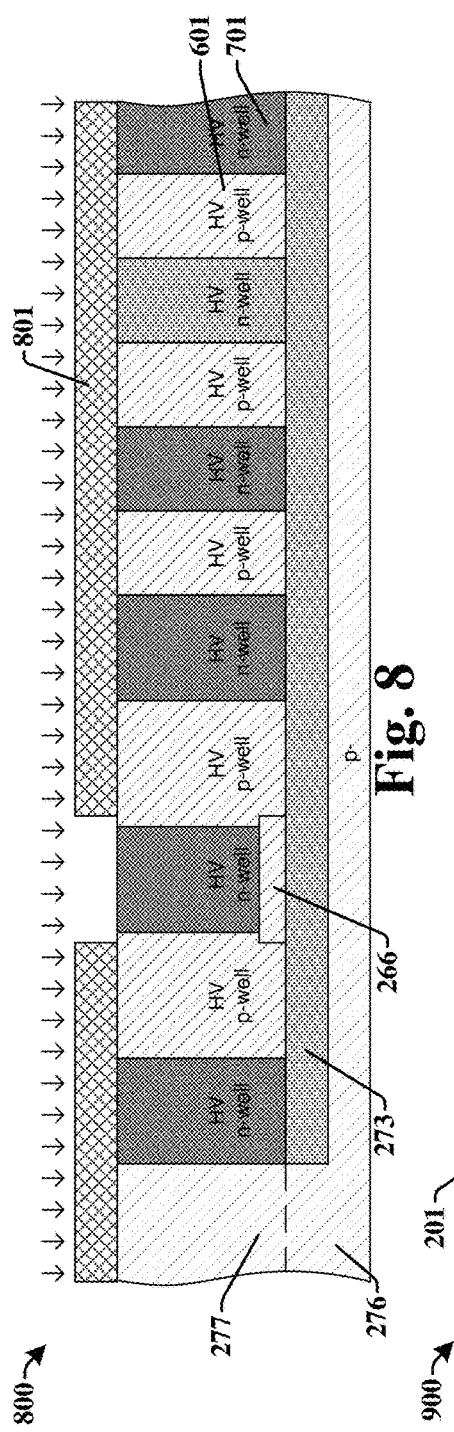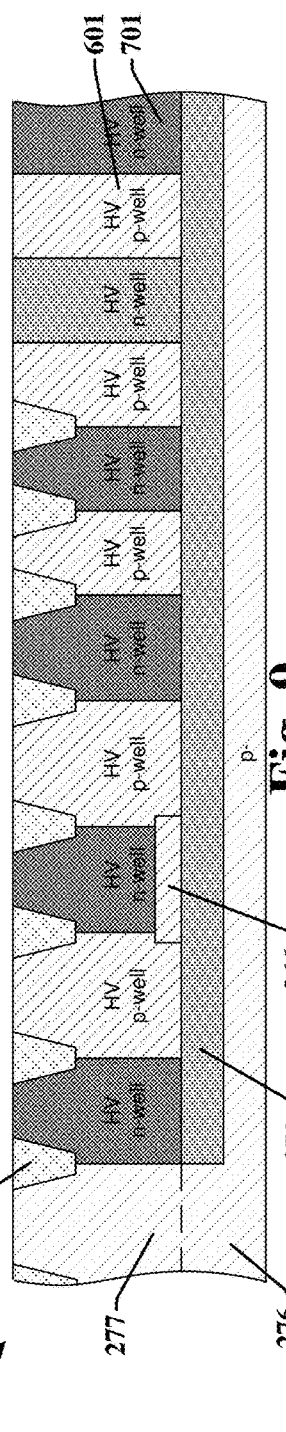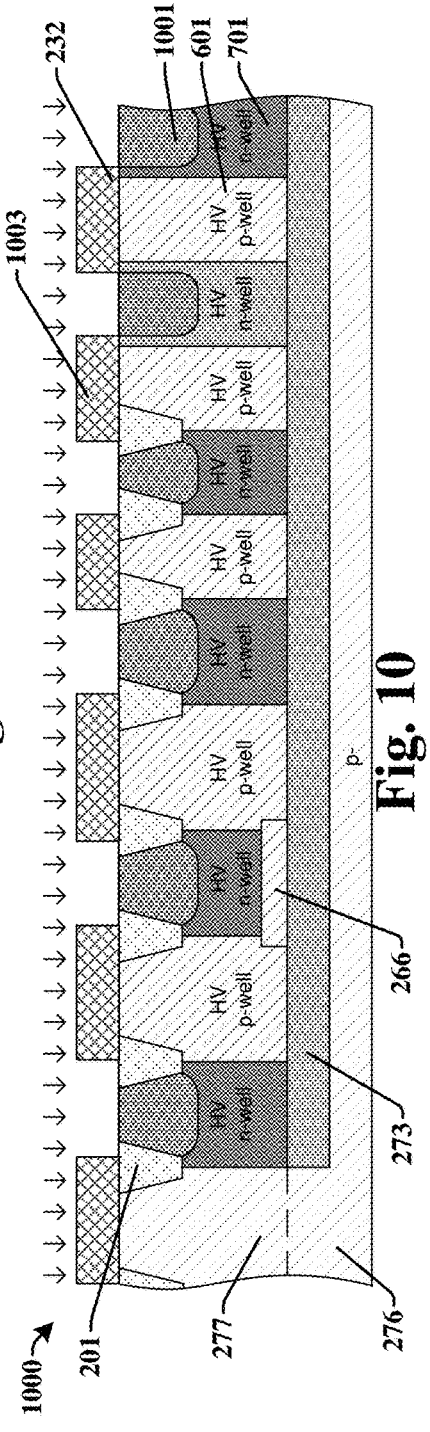

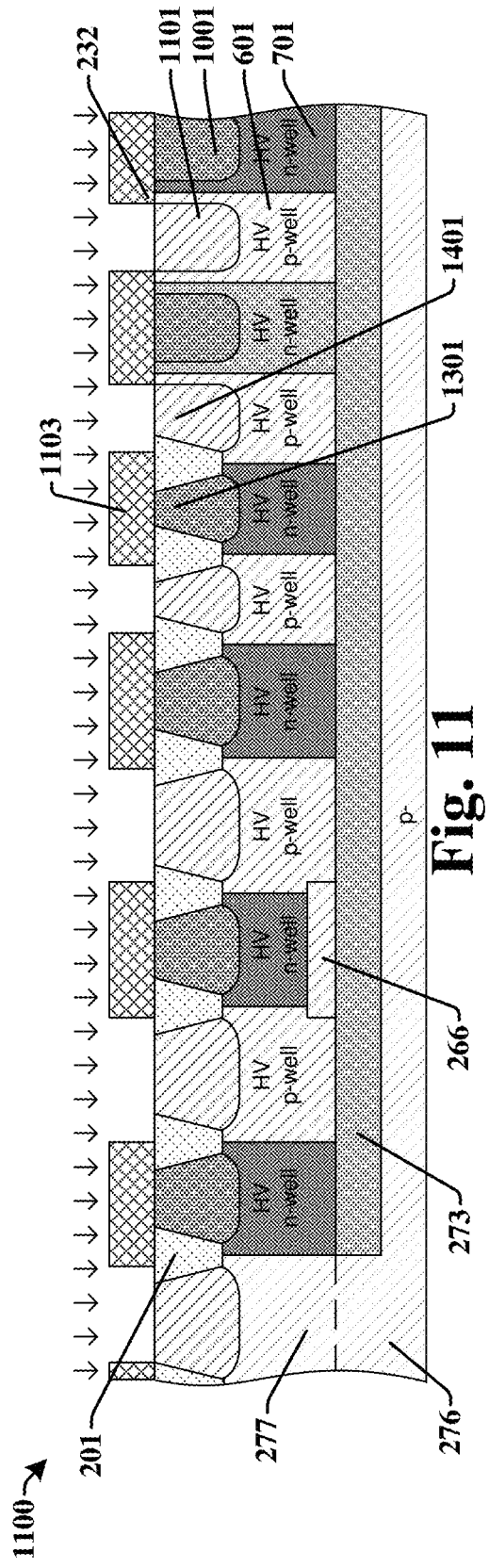
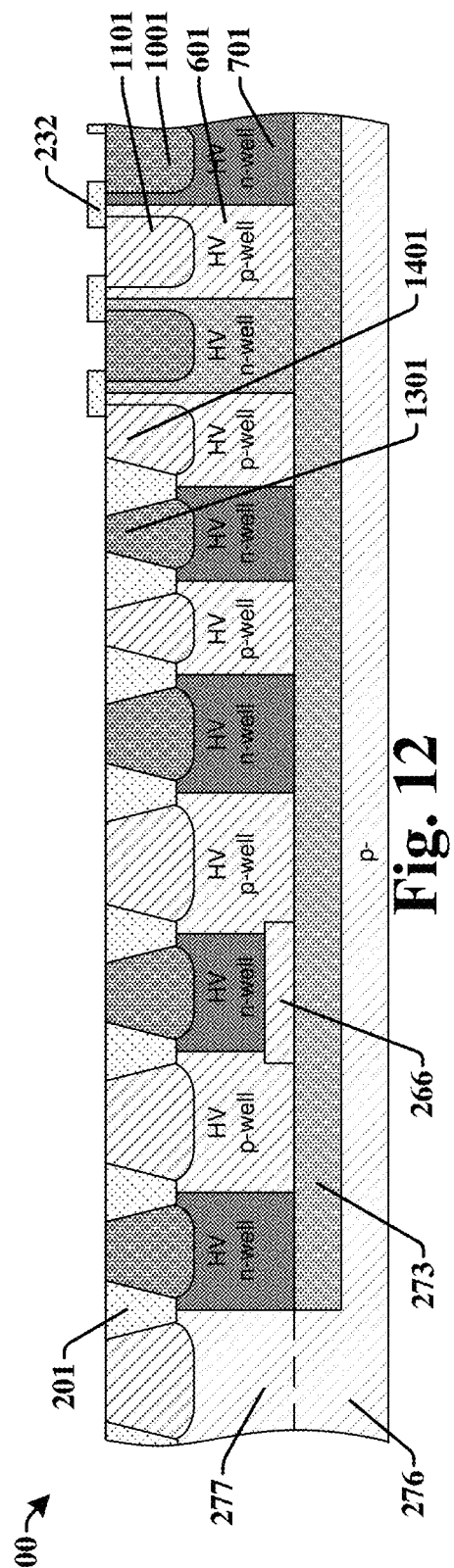

PNP CONTROLLED ESD PROTECTION DEVICE WITH HIGH HOLDING VOLTAGE AND SNAPBACK

BACKGROUND

Electrostatic discharge (ESD) protection devices are needed to protect integrated circuits. The protection challenge is particularly difficult to meet for BCD (Bipolar-CMOS-DMOS) technology. BCD technology combines multiple process technologies to provide multiple functions on a single integrated chip. Those technologies include bipolar technology for implementing analog functions, complementary metal oxide semiconductor (CMOS) technology for digital functions, and double diffused metal oxide semiconductor (DMOS) technology for power and high voltage devices. The resulting integrated chips have both high and low voltage areas. In conjunction with ever diminishing critical dimensions, these combinations result in a diminished electrically safe operating area (e-SOA). The ESD protection window, which is the area within which ESD protection must operate to avoid interfering with normal device operation while still preventing device damage, is similarly compressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4A-4D illustrates various current paths that occur in the ESD protection device of FIG. 2.

FIG. 5-14 provide a series of cross-sectional view illustrating a method of manufacturing an ESD protection device according to the present disclosure.

DETAILED DESCRIPTION

Figure 1:
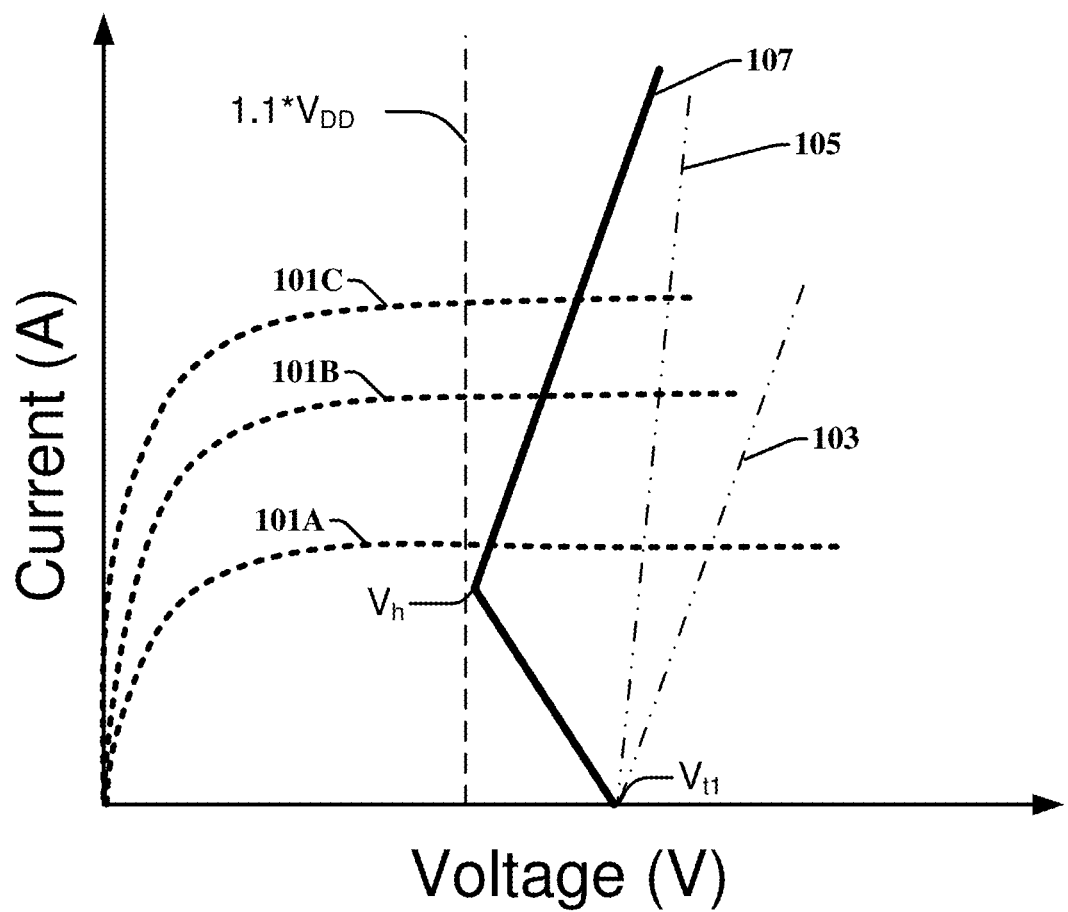
FIG. 1 is a plot illustrating a variation of voltage with current for an ESD protection device according to some aspect of the present teachings and its relationship with the e-SOA.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

While PNP-based ESD protection devices are suitable for providing high voltage circuit protection in devices with BCD technology, traditional devices have either required a large amount of area or constrained $V_{GS}$, the gate to source voltage difference at which the circuit operates. The issue and the solution provided by the present disclosure are illustrated by the current-voltage plots of FIG. 1. FIG. 1 includes plots 101A-C, which show the variation of current with drain-source voltage $V_{DS}$ for transistors operating at three different $V_{GS}$ levels and plots 103, 105, and 107, which represent current versus voltage variations for three different ESD protection devices. The plots 101A-C terminate at a voltage where device damage occurs. As $V_{GS}$ increases, the current at saturation (where the plots 101A-C level off) increases and the voltage at which device damage occurs diminishes. Both these effects contribute to making ESD protection progressively more difficult as $V_{GS}$ increases.

Plot 103 represents the variation of voltage with current in a traditional PNP-based ESD protection device subject to a transmission line pulse (TLP). The current through the traditional PNP-based ESD protection device only increases when the applied voltage increases. The slope of the increase is such that plot 103 does not intersect plots 101B or 101C. This means that the device corresponding to plot 103 protects the circuit when operating at the lower $V_{GS}$ level of plot 101A, but not at the higher $V_{GS}$ levels of plots 101B-C. Plot 105 is for another traditional PNP-based ESD protection device in which current increase much more rapidly with voltage. The device of plot 105 provides protection for the circuit operating at any of the $V_{GS}$ levels of plots 101A-C, but requires a large area of the integrated chip.

Some aspects of the present disclosure relate to an integrated chip having an ESD protection device that protects a high voltage circuit from voltage pulses between a first terminal and a second terminal over a broad range of $V_{GS}$ levels while requiring a comparatively small amount of area. The integrated chip may include a semiconductor substrate having a high voltage area and a low voltage area. The ESD protection device includes an NPN discharge structure and a PNP triggering device, both of which are formed in the semiconductor substrate. The NPN discharge structure includes an n-doped emitter, a p-doped base, and an n-doped collector. The PNP triggering device includes a p-doped emitter, an n-doped base, and a p-doped collector. The first terminal is coupled to the p-doped emitter and the n-doped base of the PNP triggering device. The first terminal is also coupled to the n-doped emitter of the NPN discharge structure. The second terminal is coupled to the n-doped collector of the NPN discharge structure. The p-doped collector of the PNP triggering device is coupled to the p-doped base of the NPN discharge structure. A TLP causes base-collector junction breakdown in the PNP triggering device, which results in a current through the PNP triggering device. That current is injected into the base of the NPN discharge structure, which results in a larger discharge current through the NPN discharge structure. The device combines advantages of a PNP-based ESD protection device including high threshold voltage, low leakage current, and resistance to accidental triggering with the snapback behavior of an NPN-based ESD protection device. The overall performance is illustrated by plot 107 of FIG. 1. As shown by plot 107, the snapback behavior expands the $V_{GS}$ range over which the circuit is protected. This coverage is achieved without requiring nearly as much device area as would be required with a traditional PNP-based ESD protection device.

The base of the NPN discharge structure is floating with respect to the first and second terminal. Floating in the context means there is no direct coupling between the base and either the first terminal or the second terminal. In some embodiments, the p-doped base is only coupled to the p-doped collector of the PNP triggering device. In some embodiments, the p-doped base is electrically separated from the first terminal by the n-doped emitter and electrically separated from the second terminal by the n-doped collector. This configuration results in the NPN discharge structure being activated only through the PNP triggering device. The base of the PNP triggering device is coupled to the first terminal through a relatively high resistance pathway. In some embodiments, that pathway includes a buried n-doped layer.

The NPN discharge structure may be used to modulate the rate of discharge and provide a desired holding voltage, $V_h$. The holding voltage is the lowest voltage that results from snapback during a discharge event (see FIG. 1). The holding voltage may be tuned to a minimum subject to a constraint that prevents inadvertent activation of the ESD protection device during normal circuit operation. That constraint is typically $V_h > 1.1 * V_{DD}$, where $V_{DD}$ is the supply voltage for the circuit. In some embodiments, $V_h$ is modulated by controlling a width of the base of the NPN discharge structure. As a consequence of this selection, the width of the NPN discharge structure base may be different from the width of its collector, its emitter, or any of the components of the PNP triggering device.

The discharge mechanism thus far described applies to a positive voltage pulse. In some embodiments, the ESD protection device provides a PN junction diode for discharging negative voltage pulses. In some embodiments, the p-doped side of the PN junction diode is coupled to the second terminal and is distinct from the p-doped areas of the NPN discharge structure and of the PNP triggering device. In some embodiments, the n-doped side of the PN junction diode overlaps the n-doped emitter of the NPN discharge structure. In some embodiments, the n-doped side of the PN junction diode overlaps the n-doped base of the PNP triggering device. In some embodiments, a first portion of the n-doped side of the PN junction diode overlaps the n-doped emitter of the NPN discharge structure and a second portion of the n-doped side of the PN junction diode overlaps the n-doped base of the PNP triggering device. This sharing provides a compact design. Also, the first portion of the n-doped side of the PN junction diode provides junction isolation between the P-doped side of the PN junction diode, which is coupled to the cathode, and the P-doped base of the PNP triggering device, which is floating.

Some aspects of the present teachings relate to a method of providing electrostatic discharge protection for an integrated chip. The method includes configuring an NPN bipolar junction transistor and a PNP bipolar junction transistor such that a positive pulse of sufficient magnitude applied between the anode and the cathode causes breakdown in a junction between a base and a collector of the PNP bipolar junction transistor, thereby turning that transistor on to provide a current that is injected into the base of the NPN bipolar junction transistor. The pulse is then discharged through the NPN bipolar junction transistor. In some embodiments, the method further includes selecting a width of the NPN bipolar junction transistor base to control the holding voltage. In some embodiments, the method further includes discharging a negative pulse through a PN diode having contacts coupled to the anode and the cathode.

Figure 2:
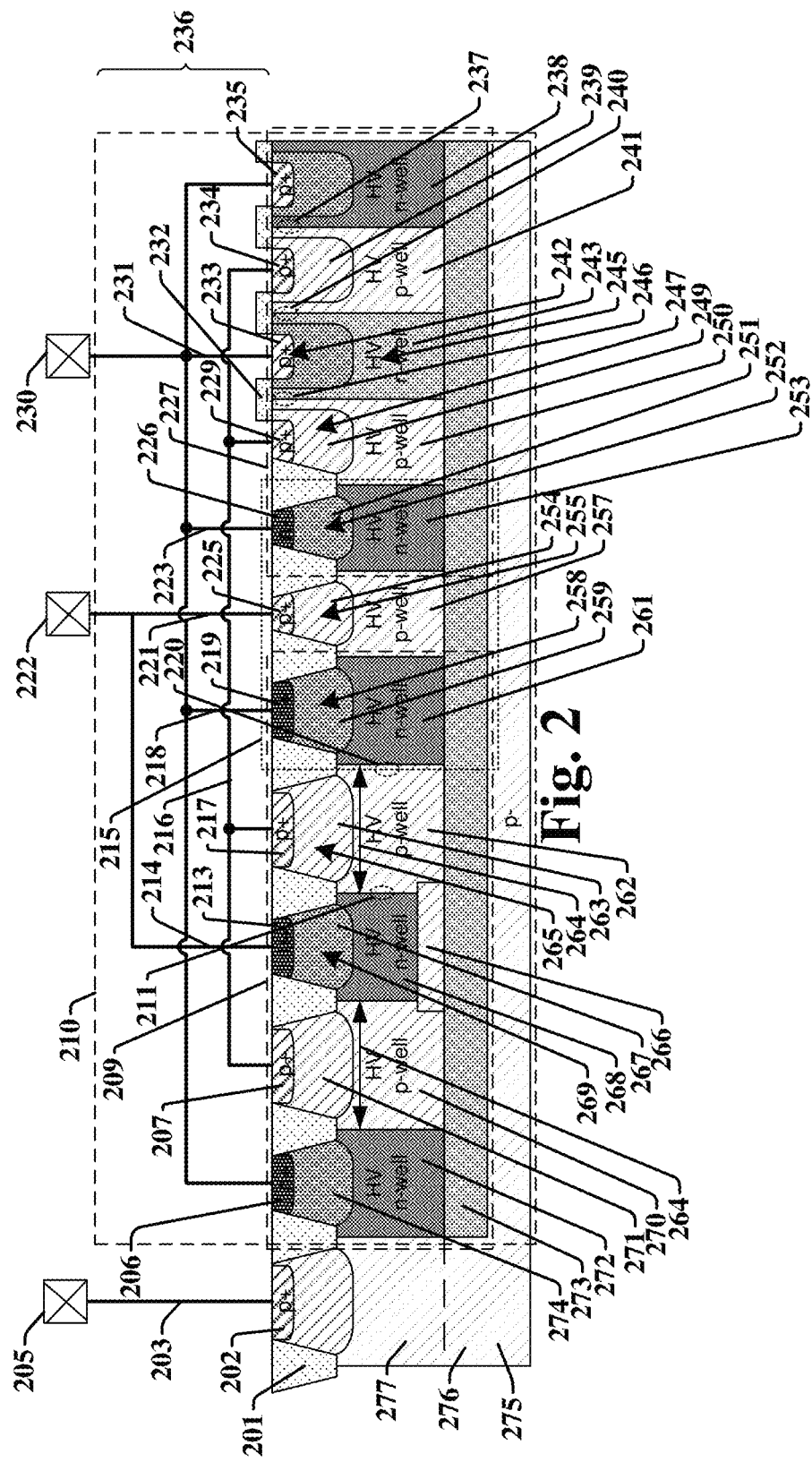
FIG. 2 is a partial cross-sectional view of an integrated circuit including an ESD protection device according to some embodiments of the present disclosure.

FIG. 2 illustrates an integrated chip 200 having a semiconductor substrate 275 and an ESD protection device 210 according to some aspects of the present teachings. The semiconductor substrate 275 may have a high voltage device area (not shown) and a low voltage device area (not shown). The integrated chip 200 may further include anode 230, which is a first terminal, cathode 222, which is a second terminal, and optionally a third terminal 205 that is coupled to and may be used to ground the semiconductor substrate 275. During normal operation, the anode 230 may have a higher voltage than the cathode 222, but the terms anode and cathode are not meant in any further limiting sense. A metal interconnect structure 236 forms connections between anode 230, cathode 222, third terminal 205, and various structures formed in the semiconductor substrate 275.

The ESD protection device 210 includes a PNP triggering device 227, an NPN discharge structure 209, and a PN diode 215. The PNP triggering device 227 includes a p-doped emitter 242, an n-doped base 245, and a p-doped collector 247. The NPN discharge structure 209 includes an n-doped emitter 258, a p-doped base 265, and an n-doped collector 269. The PN diode 215 includes a p-doped region 255 and an n-doped region 252. The n-doped region 252 includes the n-doped emitter 258 and a portion of the n-doped base 245.

In some embodiments, the p-doped region 255 of PN diode 215 is disposed between the PNP triggering device 227 and the NPN discharge structure 209, which occupy distinct areas of the semiconductor substrate 275. The p-doped region 255 may include a heavily p-doped contact region 225, a shallow p-well 254, and a high voltage p-well 257. The n-doped region 252 may include a heavily n-doped contact region 226, a shallow n-well 251, and a high voltage n-well 253. The n-doped region 252 may further include a heavily n-doped contact region 219, a shallow n-well 259, and a high voltage n-well 261. A heavily n-doped contact region 206, a shallow n-well 274, a high voltage n-well 272, and a buried n-layer 273 may provide additional parts of n-doped region 252.

Each of the PNP triggering device 227 and the NPN discharge structure 209 is a bipolar junction transistor (BJT) having three terminals provided by heavily p-doped (P+) and heavily n-doped (N+) contact areas. For the PNP triggering device 227, a heavily p-doped contact region 233 forms the emitter terminal, the heavily n-doped contact region 252 forms the base terminal, and a heavily p-doped contact region 229 forms the collector terminal. The heavily n-doped region 252 is also operative as a terminal for the PN diode 215. Optionally, a heavily p-doped contact region 235 forms a second emitter terminal and a heavily p-doped contact region 234 forms a second collector terminal.

The p-doped emitter 242 may be coextensive with the heavily p-doped contact region 233 and the heavily p-doped contact region 235. The p-doped collector 247 includes the heavily p-doped contact region 229, a shallow p-well 249, and a high voltage p-well 250. The n-doped base 245 includes the heavily n-doped contact region 226, the shallow n-well 251, the high voltage n-well 253, the buried n-layer 273, and a high voltage n-well 243. A base-collector junction 246 of the PNP triggering device 227 is formed at an interface between the high voltage n-well 243 and the high voltage p-well 250.

The p-doped collector 247 may further include the heavily p-doped contact region 234, a shallow p-well 239, and a high voltage p-well 241. The n-doped base 245 may further include a high voltage n-well 238. Accordingly, the PNP triggering device 227 may further include a second base-collector junction 240 formed between the high voltage n-well 243 and the high voltage p-well 241 and a third base-collector junction 237 formed between the high voltage n-well 238 and the high voltage p-well 241.

For the NPN discharge structure 209, the heavily n-doped contact region 219 forms the emitter terminal, a heavily p-doped contact region 217 forms the base terminal, and a heavily n-doped contact region 213 forms the collector terminal. The heavily n-doped contact region 219 is also operative as a terminal for the PN diode 215. Optionally, a heavily n-doped contact region 206 forms a second emitter terminal and a heavily p-doped contact region 207 forms a second base terminal.

The n-doped emitter 258 includes the heavily n-doped contact region 219, the shallow n-well 259, and the high voltage n-well 261. The p-doped base 265 includes the heavily p-doped contact region 217, a shallow p-well 263, and a high voltage p-well 262. The n-doped collector 269 includes the heavily n-doped contact region 213, the shallow n-well 267, and the high voltage n-well 268. The n-doped collector 269 is isolated from buried n-layer 273 by a deep p-well 266.

The n-doped emitter 258 may further include the heavily n-doped contact region 206, a shallow n-well 274, and a high voltage n-well 272. The p-doped base 265 may further include the heavily p-doped contact region 207, a shallow p-well 271, and a high voltage p-well 270. The NPN discharge structure 209 has a base width 264 that is a distance between the high voltage n-well 261 and the high voltage n-well 268 and is also distance between the high voltage n-well 268 and the high voltage n-well 272. The different parts of the p-doped base 265 such high voltage p-well 262 and high voltage p-well 270 may be distinct or may be contiguous. In some embodiments, they form a ring around the n-doped collector 269. Likewise, the different parts of the n-doped emitter 258 such as high voltage n-well 261 and high voltage n-well 272 may be distinct or may be contiguous and in some embodiments form a ring around the n-doped collector 269 and the p-doped base 265.

Figure 2A:
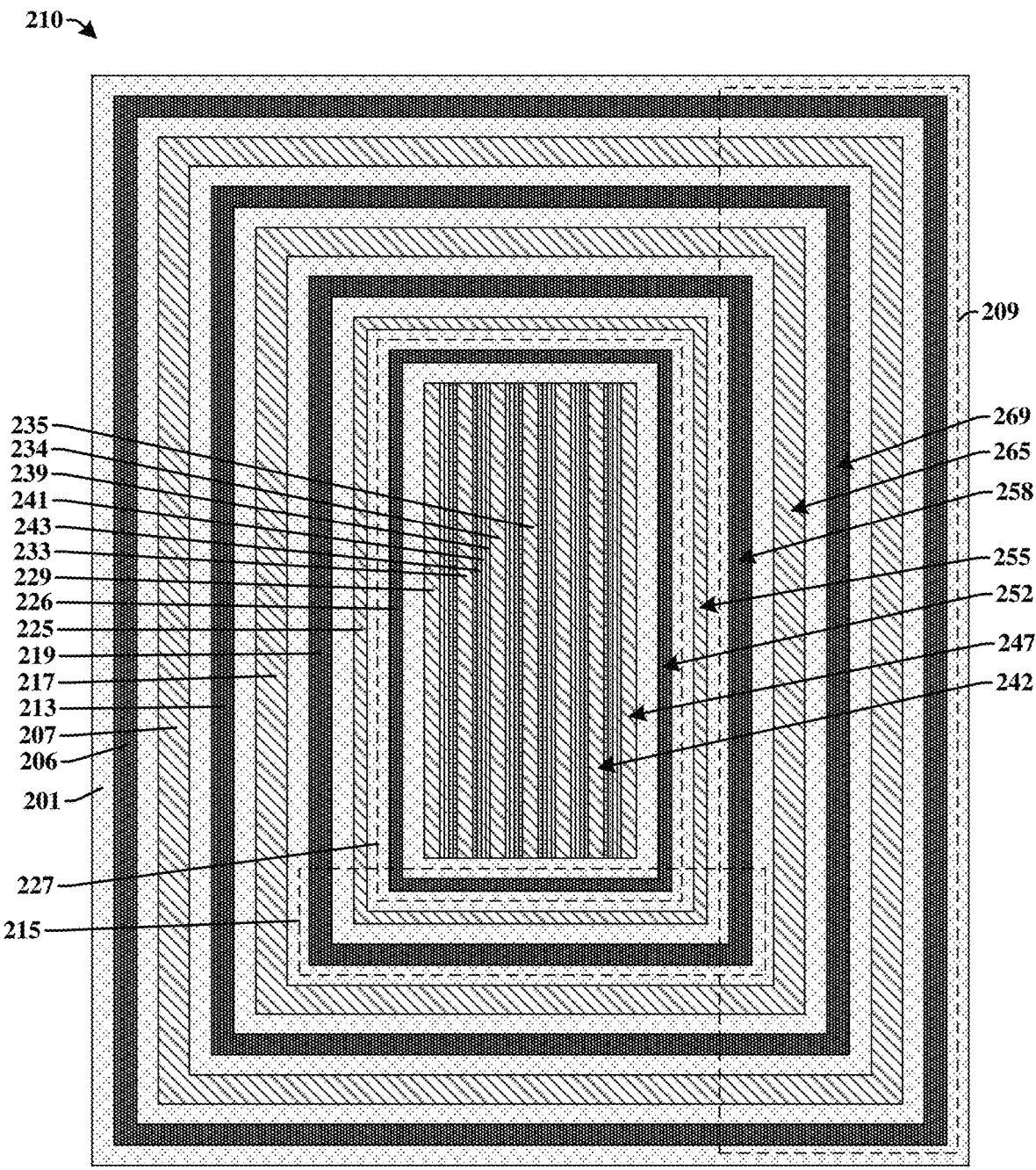
FIG. 2A illustrates a plan view of the ESD protection device of FIG. 2.

FIG. 2A illustrates an example plan view of the ESD protection device 210. As shown by the example, in some embodiments the NPN discharge structure 209 surrounds the PNP triggering device 227. In some embodiments, the NPN discharge structure 209 also surrounds the PN diode 215. In some embodiments, the PN diode 215 surrounds the PNP triggering device 227. In some embodiments, the n-doped region 252, which is coupled to the n-doped base 245, surrounds the other elements of the PNP triggering device 227 including the p-doped emitter 242 and the p-doped collector 247. These surrounding elements may be described as ring structures. In some embodiments, the p-doped emitter 242 and the p-doped collector 247 are in the form of strips rather than rings. In some embodiments, the p-doped emitter 242 is provided by multiple fingers each having the same area. In some embodiments, the p-doped collector 247 is provided by multiple fingers each having the same area. In some embodiments, each of the p-doped emitter 242 and the p-doped collector 247 includes three or more fingers.

A dopant concentration in the n-doped emitter 258 decreases from the heavily n-doped contact region 219 to a base-emitter interface 220 of the NPN discharge structure 209. Likewise, a dopant concentration in the n-doped collector 269 decreases from the heavily n-doped contact region 213 to a base-collector interface 211 of the NPN discharge structure 209. Both the base-emitter interface 220 and base-collector interface 211 are formed by interfaces between high voltage wells and provide a large area for conduction.

Anode 230 is connected to the heavily n-doped contact region 226 of the n-doped base 245 through a connection 223, to the p-doped emitter 242 through a connection 231, and to the n-doped emitter 258 through a connection 218, all of which connections are formed within the metal interconnect structure 236. The metal interconnect structure 236 also includes a connection 216 between the p-doped collector 247 and the p-doped base 265. Cathode 222 is connected to the n-doped collector 269 through a connection 214 and to the p-doped region 255 of PN diode 215 through a connection 221. The third terminal 205 may be coupled to a heavily p-doped contact region 202 through a connection 203. The heavily p-doped contact region 202 is coupled to the semiconductor substrate 275, which is lightly p-doped, and may be used to ground the semiconductor substrate 275.

The semiconductor substrate 275 may include a semiconductor body such as a die cut from a single crystal semiconductor wafer, a silicon-on-insulator (SOI) type structure, or any other type of semiconductor body. The semiconductor may be silicon, or another semiconductor material such as SiGe and/or other group III, group IV, and/or group V element, combination thereof, or the like. In some embodiments, the semiconductor substrate 275 includes a semiconductor body 276 and an epitaxial layer 277 grown on the semiconductor body 276. The buried n-layer 273 may be formed in the semiconductor body 276. The deep p-well 266 may be formed over the buried n-layer 273 and may be disposed in the epitaxial layer 277, in the semiconductor body 276, or overlapping the epitaxial layer 277 and the semiconductor body 276.

The heavily n-doped contact region 206, 213, 219, and 226 are isolated from the heavily p-doped contact regions 202, 207, 217, 225, and 229 by shallow trench isolation (STI) structures 201. The heavily p-doped contact regions 229, 233, 234, and 235 are junction isolated. The junctions may be covered by resist protective oxide 232. These different isolation structures reflect the greater isolation demands of the NPN discharge structure 209 as compared to the PNP triggering device 227, however, any suitable type of isolation structure may be used in either device. Junction isolation allows the PNP triggering device 227 to be more compact. Junction isolation provided by high voltage n-well 261 is also used to isolate the p-doped base 265, which is floating, from the p-doped region 255, which is the side of the PN diode 215 that is coupled to the cathode 222.

Figure 3:
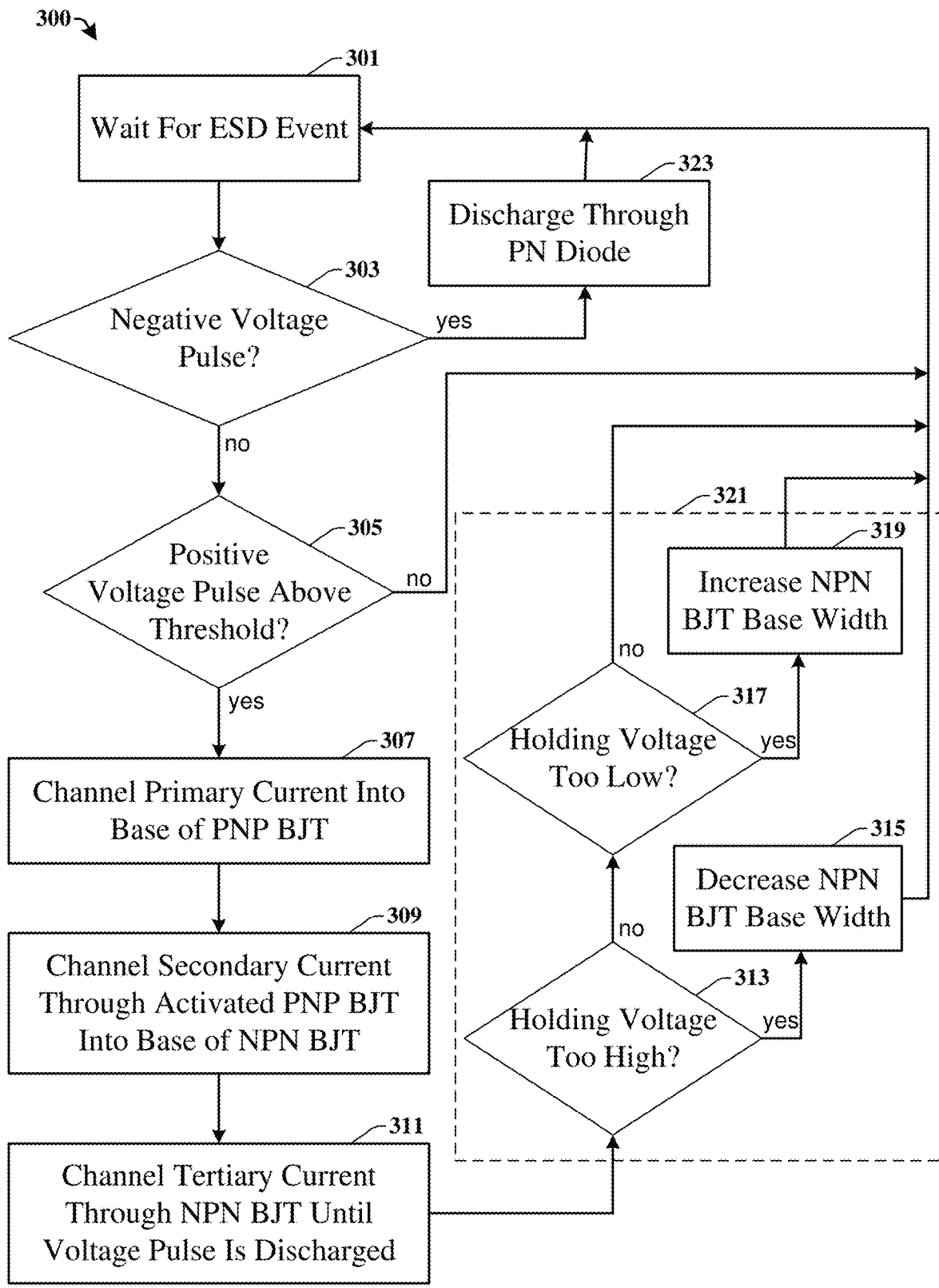
FIG. 3 is a flow chart illustrating the operation of an ESD protection device according to some embodiments of the present disclosure and a method of modifying that device to tune the holding voltage.

FIG. 3 provides a flow chart illustrating a method 300 by which the ESD protection device 210 operates. Most of the acts of the method 300 may be implemented passively by the ESD protection device 210, however, the method 300 also includes a group of acts 321 that may be implemented through an iterative design process. While the method 300 is illustrated and described herein as a series of acts or events, it will be appreciated that the illustrated ordering of such acts or events are not to be interpreted in a limiting sense. For example, some acts may occur concurrently with other acts. In addition, not all the illustrated acts of the method 300 are required to implement some aspects or embodiments of the present disclosure.

Figure 4A:
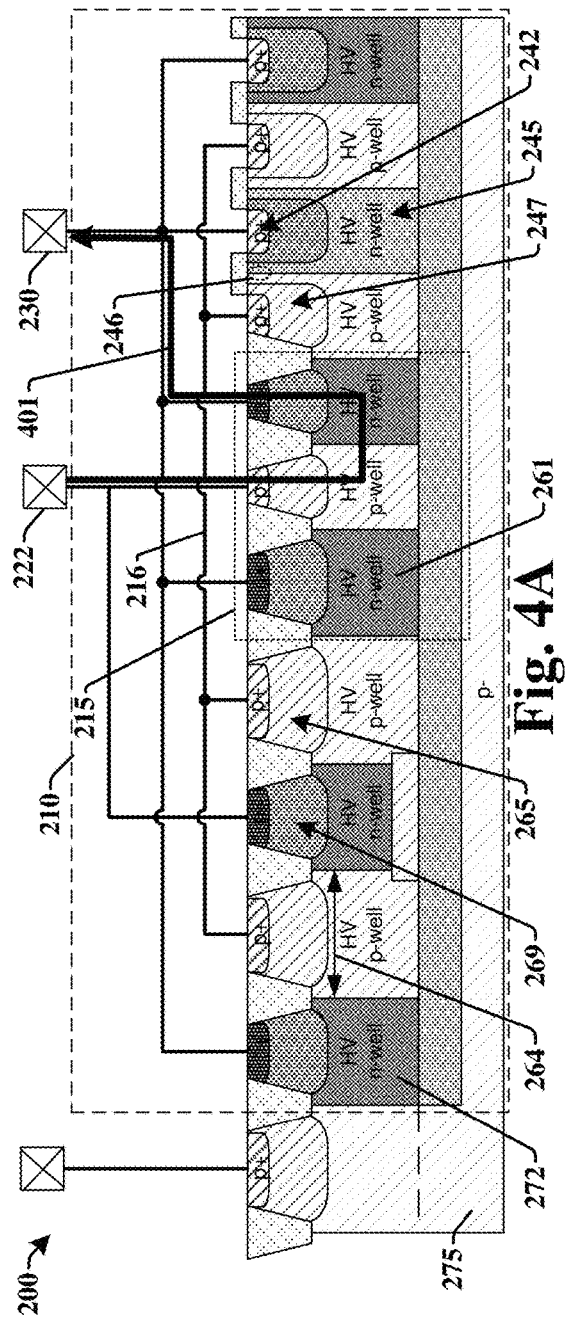

The method 300 begins with act 301, in which the ESD protection device 210 idles in a state of preparedness for an ESD event. Upon the occurrence of an ESD event, the ESD protection device 210 responds. In accordance with act 303, if the ESD event is a negative voltage pulse the ESD protection device 210 responds in accordance with act 323, discharging the negative voltage pulse through a current 401 that goes from the cathode 222 to the anode 230 and is gated by the PN diode 215 as illustrated in FIG. 4A. Note that there is an alternate path for the current 401 that pass through the high voltage n-well 261 and another alternate path that passes through the high voltage n-well 272. These alternate current paths will be recognized by one of ordinary skill in the art and are not illustrated to make the drawing and related description easier to understand, a practice mirrored in the description of positive voltage pulse discharge that follows.

Figure 4B:
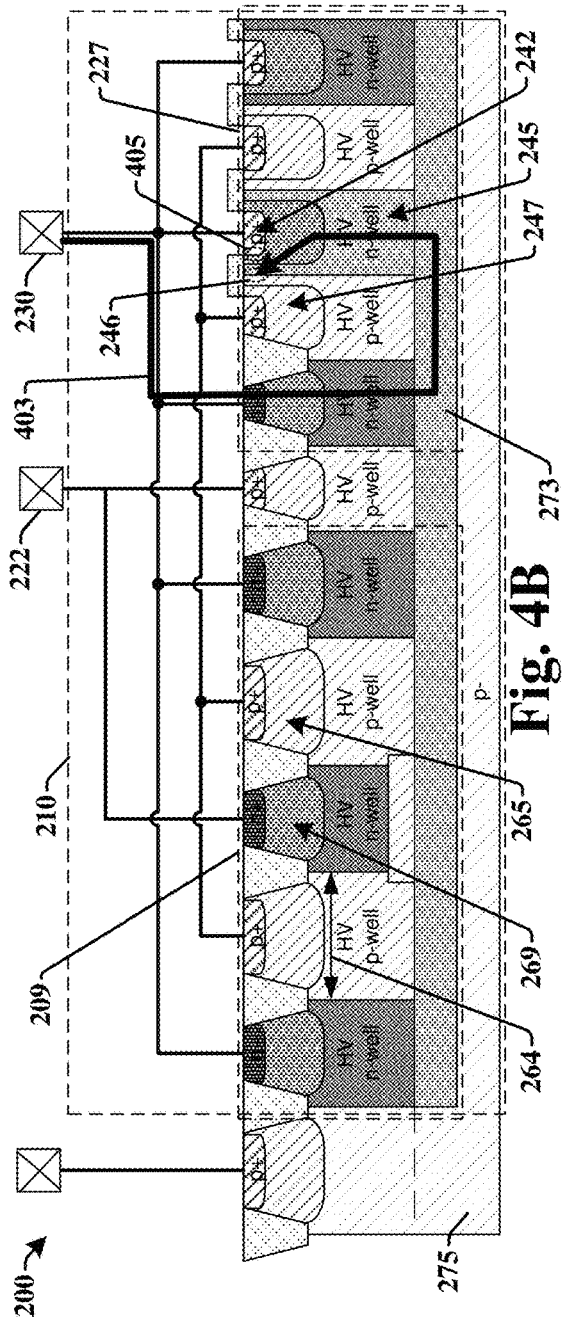

In accordance with act 305, if the ESD event is a positive voltage pulse above a certain threshold ($V_{t1}$ of FIG. 1) the ESD protection device 210 responds in accordance with act 307. If neither condition is met, the ESD protection device 210 remains inactive and continues to idle in act 301. Act 307 is channeling a current 403 from the positive voltage pulse, into the n-doped base 245 of the PNP triggering device 227 as illustrated in FIG. 4B. The current 403, which is an avalanche current, causes breakdown at the base-collector junction 246 between the n-doped base 245 and the p-doped collector 247, generating electrons and holes and forward biasing a junction 405 between the p-doped emitter 242 and the n-doped base 245. This turns on the bi-polar junction transistor embodied by the PNP triggering device 227 and results in the current 407 illustrated in FIG. 4C.

Act 309 is channeling the current 407 into the p-doped base 265 of the NPN discharge structure 209. The path of the current 407 may include the connection 216 that is formed within the metal interconnect structure 236. The current 407 discharges from the p-doped base 265 into the n-doped collector 269 and turns on the NPN discharge structure 209, resulting in the current 409 illustrated in FIG. 4D. The current 409 passes from the anode 230 to the cathode 222 through the NPN discharge structure 209. Act 311 is discharging the positive voltage pulse through the current 409.

A relationship between current and voltage across the ESD protection device 210 during discharge of the positive voltage pulse is illustrated by plot 107 of FIG. 1. As the current increases, the voltage goes through a minimum represented by the holding voltage, $V_h$. The group of acts 321 represent a process by which the ESD protection device 210 may be modified to tune the holding voltage. These acts may be carried out by building and testing successive versions of the ESD protection device 210, by numerical simulations of the ESD protection device 210, or a combination of the foregoing.

Act 313 determines if the holding voltage is higher than a targeted range, in which case the electrically safe operating area is smaller than it could be. If the holding voltage is too high, the base width 264 of the NPN discharge structure 209 is decreased in Act 315. Act 317 determines if the holding voltage is lower than the targeted range, in which case the risk of latch-up is considered too great. If the holding voltage is too low, the base width 264 of the NPN discharge structure 209 is increased in Act 319. Thus, the base width 264 may be adjusted until the holding voltage is within the target range.

The target range depends on a high voltage $V_{DD}$ for the integrated chip 200. In some embodiments, $V_{DD}$ is 18 V or higher. In some embodiments, $V_{DD}$ is 24 V. In some embodiments, the target holding voltage is about 1.1 time the holding voltage, e.g., about 26.4 V. In some embodiments, the target range for the holding voltage places the holding voltage within 1 V of this target holding voltage. In some embodiments, the target range for the holding voltage places the holding voltage within 0.5 V of the target holding voltage.

The base width 264 that provides the desired holding voltage may vary depending on a variety of factors including most notably $V_{DD}$. In some embodiments, the base width 264 is in a range from 1 μm to 100 μm. In some embodiments, the base width 264 is in a range from 2 μm to 50 μm. In some embodiments, the base width 264 is in a range from 4 μm to 25 μm. In some embodiments, the base width 264 is in a range from 5 μm to 12 μm.

FIGS. 5-14 provide a series of cross-sectional views 500-1400 that illustrate an integrated chip including an ESD protection device according to the present disclosure at various stages of manufacture according to a process of the present disclosure. Although FIGS. 5-14 are described in relation to a series of acts, it will be appreciated that the order of the acts may in some cases be altered and that this series of acts are applicable to structures other than the ones illustrated. In some embodiments, some of these acts may be omitted in whole or in part. Furthermore, it will be appreciated that the structures shown in FIGS. 5-14 are not limited to a method of manufacture but rather may stand alone as structures separate from the method.

As shown by the cross-sectional view 500 of FIG. 5 the process may begin with forming a photoresist mask 501 and implanting an n-type dopant to form the buried n-layer 273 near a surface of a semiconductor body 276. An n-type dopant may be phosphorus, antimony, arsenic, a combination thereof, or the like. After the ion implantation, the photoresist mask 501 may be stripped. Alternatively, the buried n-layer 273 may be formed by diffusing the n-type dopant into the semiconductor body 276. The semiconductor body 276 may be lightly p-doped or have another suitable doping.

As shown by the cross-sectional view 600 of FIG. 6, an epitaxial layer 277 may be grown over the structure illustrated by the cross-sectional view 500 of FIG. 5. The epitaxial layer 277 may be grown with a p-type dopant in a concentration suitable for high voltage p-wells. A p-type dopant may be boron, indium, or the like. In some embodiments, the p-type dopant concentration is in a range from $10^{14}/cm^3$ to $10^{17}/cm^3$. Alternatively, the epitaxial layer 277 may be undoped or n-doped and ion implantation may be used to form high voltage p-wells in a subsequent step.

As shown by the cross-sectional view 700 of FIG. 7, a photoresist mask 703 may be formed over the structure illustrated by the cross-sectional view 600 of FIG. 6 and an n-type dopant may be implanted to form high voltage n-wells 701. In some embodiments, the high voltage n-wells 701 have n-type doping at a concentration in the range from $10^{14}/cm^3$ to $10^{17}/cm^3$.

As shown by the cross-sectional view 800 of FIG. 8, a photoresist mask 801 may be formed and a p-type dopant may be implanted at high energy to form the deep p-well 266. Alternatively, the deep p-well 266 may be formed by diffusing the p-type dopant into the semiconductor body 276 prior to forming the epitaxial layer 277. In some embodiments, the p-type dopant concentration in deep p-well 266 is in a range from $10^{15}/cm^3$ to $10^{18}/cm^3$.

As shown by the cross-sectional view 900 of FIG. 9, STI structures 201 may be formed in the epitaxial layer 277. Forming the STI structures 201 may include steps such as forming a mask, etching trenches in the epitaxial layer 277, filling the trenches with dielectric, and chemical mechanical polishing. The dielectric may be $SiO_2$, high-density plasma (HDP) oxide, or any other suitable dielectric. Isolation structures may also be formed by oxidizing portions of the epitaxial layer 277. The STI structures 201 may be formed earlier or later in the process.

As shown by the cross-sectional view 1000 of FIG. 10, a photoresist mask 1003 may be formed and an n-type dopant may be implanted to form shallow n-wells 1001. In some embodiments, this implant also provides source/drain regions (not shown) in a low voltage area of the integrated chip 200. In some embodiments, the n-type dopant concentration in shallow n-wells 1001 is in a range from $10^{15}/cm^3$ to $10^{18}/cm^3$.

As shown by the cross-sectional view 1100 of FIG. 11, a photoresist mask 1103 may be formed and a p-type dopant is implanted to form shallow p-wells 1101. In some embodiments, the p-type dopant concentration in shallow p-wells 1101 is in a range from $10^{15}/cm^3$ to $10^{18}/cm^3$.

As shown by the cross-sectional view 1200 of FIG. 12, a resist protective oxide layer 232 may be formed and patterned over the structure shown by the cross-sectional view 1100 of FIG. 11. Alternatively, the resist protective oxide layer 232 may be formed earlier in the process. The resist protective oxide layer 232 may be silicon dioxide ($SiO_2$), silicon nitride (SiN), silicon oxynitride (SION), any other suitable dielectric, or the like.

Figure 13:
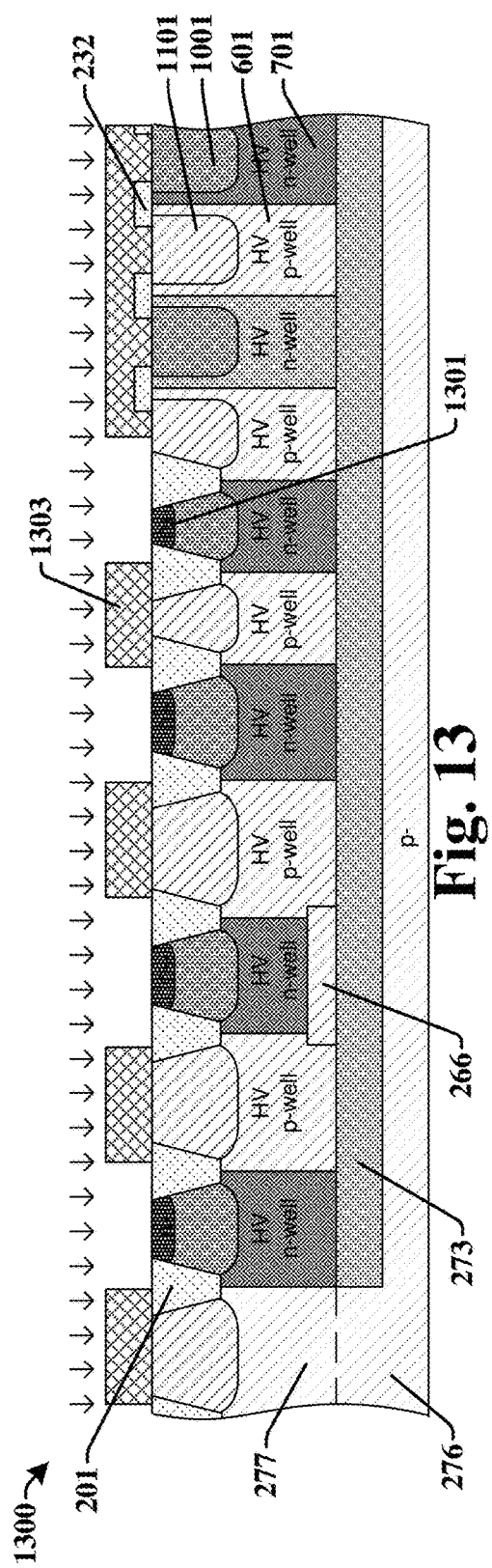

As shown by the cross-sectional view 1300 of FIG. 13, a photoresist mask 1303 may be formed and an n-type dopant may be implanted at low energy to form heavily n-doped contacts 1301. In some embodiments, the n-type dopant concentration in heavily n-doped contacts 1301 is $10^{20}/cm^3$ or greater.

Figure 14:
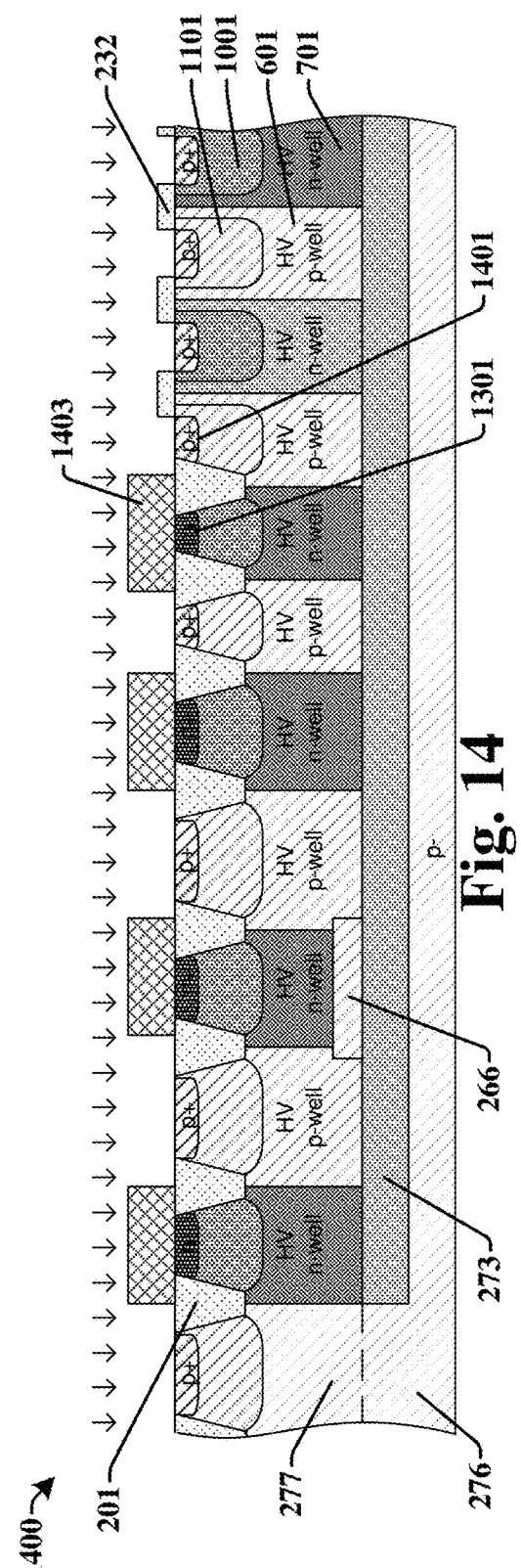

As shown by the cross-sectional view 1400 of FIG. 14, a photoresist mask 1403 may be formed and a p-type dopant may be implanted at low energy to form heavily p-doped contacts 1401. In some embodiments, the p-type dopant concentration in heavily p-doped contacts 1401 is over $10^{20}/cm^3$. Further processing, including forming the metal interconnect structure 236 in back-end-of-line (BEOL) processing, can produce the integrated chip 200 of FIG. 2.

Some embodiments of the present disclosure relate to an integrated chip having a first terminal, a second terminal, and a semiconductor substrate. Logic devices may be formed on a first area of the semiconductor substrate and high voltage devices may be formed on a second area of the semiconductor substrate. The integrated chip includes an electrostatic discharge (ESD) protection device having an NPN discharge structure and a PNP triggering device. The NPN discharge structure includes an n-doped emitter, a p-doped base, and an n-doped collector, each of which is formed in the semiconductor substrate. The PNP triggering device includes a p-doped emitter, an n-doped base, and a p-doped collector, each of which is formed in the semiconductor substrate. The first terminal is coupled by a first coupling to the p-doped emitter, by a second coupling to the n-doped base, and by a third coupling to the n-doped emitter. The second terminal is coupled by a fourth coupling to the n-doped collector. The p-doped collector is coupled by a fifth coupling to the p-doped base. The first coupling, the second coupling, the third coupling, the fourth coupling, and the fifth coupling respectively include a first, a second, a third, a fourth, and a fifth conductor formed outside the semiconductor substrate. In some embodiments, the p-doped base is floating except with respect to the fifth coupling. In some embodiments, the second coupling, which is from the first terminal to the n-doped base, goes through a buried n-doped layer within the semiconductor substrate.

Some embodiments of the present disclosure relate to an integrated chip having a first terminal, a second terminal and an electrostatic discharge (ESD) protection device coupled between the first terminal and the second terminal. The ESD protection device includes an NPN discharge structure activated by a PNP triggering device. The NPN discharge structure and the PNP triggering device are formed in a semiconductor substrate. The NPN discharge structure includes a first n-doped region and a second n-doped region separated by a p-doped region. The PNP triggering device includes a first p-doped region and a second p-doped region separated by an n-doped region. The first p-doped region of the PNP triggering device is coupled to the p-doped region of the NPN discharge structure through a metal interconnect structure disposed above the semiconductor substrate. In some embodiments, the ESD protection device further includes a PN diode formed in the semiconductor substrate. A first electrode of the PN diode is coupled to the first terminal and a second electrode of the PN diode is coupled to the second terminal.

Some embodiments of the present disclosure relate to a method of providing electrostatic discharge protection for an integrated chip. The method includes providing an NPN bipolar junction transistor in a semiconductor substrate, the NPN bipolar junction transistor having an n-doped emitter, a p-doped base, and an n-doped collector and providing a PNP bipolar junction transistor in the semiconductor substrate, the PNP bipolar junction transistor having a p-doped emitter, an n-doped base, and a p-doped collector. An anode is coupled to the p-doped emitter, the n-doped base, and the n-doped emitter. A cathode is coupled to the n-doped collector. The p-doped collector is coupled to the p-doped base. According to the method, a positive voltage pulse applied between the anode and the cathode is discharged by having the positive voltage pulse cause a breakdown in a junction between the n-doped base and the p-doped collector thereby turning on the PNP bipolar junction transistor, then turning on the NPN bipolar junction transistor by injecting a current from the PNP bipolar junction transistor into the p-doped base. In some embodiments, the method further includes discharging a negative voltage pulse applied between the anode and the cathode through a PN diode formed in the semiconductor substrate.

Some embodiments of the present disclosure relate to a method of tuning a holding voltage in an electrostatic discharge device according to the present teachings. The method includes increasing a width for the p-doped base to increase the holding voltage and decreasing a width of the p-doped base to reduce the holding voltage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an electrostatic discharge protection device on an integrated chip, the method comprising:
   forming an NPN bipolar junction transistor in a semiconductor substrate, the NPN bipolar junction transistor comprising an n-doped emitter, a p-doped base, and an n-doped collector;
   forming a PNP bipolar junction transistor in the semiconductor substrate, the PNP bipolar junction transistor comprising a p-doped emitter, an n-doped base, and a p-doped collector; and
   forming a metal interconnect comprising:
      a first metal structure that couples an anode terminal to the p-doped emitter, the n-doped base, and the n-doped emitter;
      a second metal structure that couples a cathode terminal to the n-doped collector; and
      a third metal structure that couples the p-doped collector to the p-doped base;
   wherein the p-doped collector and the p-doped base are physically separated from one another.

2. The method of claim 1, wherein the NPN bipolar junction transistor surrounds the PNP bipolar junction transistor.

3. A method of forming an integrated circuit with an electrostatic discharge protection device, the method comprising:
   providing a p-doped semiconductor substrate with a buried n-doped layer;
   forming a plurality of n-wells in the p-doped semiconductor substrate above the buried n-doped layer, wherein:
      the plurality of n-wells extend to a depth of the buried n-doped layer;
      the plurality of n-wells comprise one or more first n-wells, one or more second n-wells, one or more third n-wells, and one or more fourth n-wells;
      a plurality of p-wells are provided by portions of the p-doped semiconductor substrate between neighboring members of the plurality of n-wells;
      the plurality of p-wells comprise one or more first p-wells and one or more second p-wells;
      the first p-wells abut the first n-wells; and
      the second p-wells abut the third n-wells and the fourth n-wells;
   doping to provide deep p-wells that isolate the fourth n-wells from the buried n-doped layer;
   implanting p-type dopants to provide first collector contact regions directly above the first n-wells, first emitter contact regions directly above the first p-wells, and second base contact regions directly above the second p-wells;
   implanting n-type dopants to provide first base contact regions directly above the second n-wells, second collector contact regions directly above the third n-wells, and second emitter contact regions directly above the fourth n-wells; and
   forming a metal interconnect comprising:
      a first metal structure that couples an anode terminal to the first collector contact regions, the first base contact regions, and the second collector contact regions;
      a second metal structure that couples a cathode terminal to the second emitter contact regions; and
      a third metal structure that couples the first emitter contact regions to the second base contact regions.

4. The method of claim 3, further comprising forming shallow trench isolation structures at edges of the second n-wells, the third n-wells, and the fourth n-wells.

5. The method of claim 3, further comprising covering edges of the first n-wells with resist protective oxide.

6. The method of claim 3, further comprising doping to form more heavily n-doped areas in upper portions of the plurality of n-wells.

7. The method of claim 3, wherein the third n-wells and the fourth n-wells surround the first n-wells.

8. The method of claim 7, wherein the second n-wells surround the first n-wells.

9. The method of claim 3, further comprising doping to form more heavily p-doped areas in upper portions of the plurality of p-wells.

10. The method of claim 3, further comprising doping to form more heavily n-doped areas in upper portions of the plurality of n-wells.

11. The method of claim 3, wherein:
   the plurality of p-wells further comprises a third p-well;
   the third p-well abuts one of the second n-wells or one of the third n-wells;
   implanting p-type dopants provide p-doped contact region directly above the third p-wells; and
   the second metal structure couples the cathode terminal to the p-doped contact region.

12. The method of claim 11, wherein the third p-well abuts one of the second n-wells and one of the third n-wells.

13. The method of claim 3, wherein:
   the first p-wells have first widths;
   the second p-wells have second widths; and
   the second widths are different from the first widths.

14. The method of claim 3, wherein the one or more first p-wells comprise at least three first p-wells.

15. A method of forming an integrated circuit with an electrostatic discharge protection device, the method comprising:
   forming an n-doped buried layer in a semiconductor substrate;
   doping the semiconductor substrate to form alternating and adjacent first n-wells and first p-wells in a first region, an adjacent second n-well and second p-well in a second region, and alternating and adjacent third n-wells and third p-wells in a third region, wherein the first n-wells, the first p-wells, the second n-well, the second p-well, third n-wells, and the third p-wells extend to a depth of the n-doped buried layer;
   masking every other third n-well so that a first group of third n-wells is masked and a second group of third n-wells is unmasked;
   doping to form deep p-wells under the second group of third n-wells while the first group of third n-wells, the first region, and the second region are masked;
   doping to form n-doped contact regions directly over the second n-well and the third n-wells;
   doping to form p-doped contact regions directly over the first n-wells, the first p-wells, the second p-well and the third p-wells; and
   forming a metal interconnect connecting the p-doped contact regions over the first n-wells, the n-doped contact regions over the second n-well, and the n-doped contact regions over the first group of third n-wells to a first terminal, connecting the p-doped contact regions over the first p-wells and the p-doped contact regions over the third p-wells to each other, and connecting the p-doped contact regions over the second p-well and the n-doped contact regions over the second group of the third n-wells to a second terminal.

16. The method of claim 15, wherein the third region surrounds the first region.

17. The method of claim 15, wherein the second region is between the first region and the third region.

18. The method of claim 15, further comprising forming shallow trench isolation structures at boundaries between the third n-wells and the third p-wells.

19. The method of claim 18, further comprising forming oxide strips over the semiconductor substrate at boundaries between the first n-wells and the first p-wells.

20. The method of claim 15, further comprising doping the semiconductor substrate to form first shallow n-wells over the first n-wells and first shallow p-wells over the first p-wells, wherein the first shallow p-wells have higher dopant concentration than the first p-wells and lower dopant concentration than the p-doped contact regions over the first p-wells.

* * * * *